United States Patent [19]

Hashimoto et al.

[11] Patent Number: 5,186,788
[45] Date of Patent: Feb. 16, 1993

[54] FINE PATTERN FORMING METHOD

[75] Inventors: Kazuhiko Hashimoto, Moriguchi; Kazuhiro Yamashita, Amagasaki; Noboru Nomura, Kyoto, all of Japan

[73] Assignee: Matsushita Electric Industrial Co., Ltd., Osaka, Japan

[21] Appl. No.: 655,237

[22] Filed: Feb. 12, 1991

Related U.S. Application Data

[63] Continuation of Ser. No. 224,008, Jul. 25, 1988, abandoned.

[30] Foreign Application Priority Data

Jul. 23, 1987 [JP] Japan ................. 62-183973
Apr. 28, 1988 [JP] Japan ................. 63-106301

[51] Int. Cl.5 .................................. G03C 5/00
[52] U.S. Cl. ................. 156/643; 156/659.1; 156/661.1; 156/668; 430/296; 430/313; 430/325; 430/394
[58] Field of Search ............ 156/661.1, 659.1, 628, 156/643, 654, 668; 430/311, 296, 313, 325, 326, 328, 394, DIG. 942

[56] References Cited

U.S. PATENT DOCUMENTS

| | | |
|---|---|---|
| 4,293,374 | 10/1981 | Chaudhari et al. ............ 156/659.1 |
| 4,377,734 | 3/1983 | Mashiko et al. .................. 156/628 |
| 4,394,211 | 7/1983 | Uchiyama et al. ................ 156/668 |
| 4,403,151 | 9/1983 | Mochiji et al. ................ 430/942 X |
| 4,405,710 | 9/1983 | Balasubramanyam et al. .... 437/928 X |
| 4,514,251 | 4/1985 | van Ommen et al. ............ 156/643 |
| 4,530,734 | 7/1985 | Klima .............................. 156/628 |
| 4,552,831 | 11/1985 | Liu ................................. 156/628 |
| 4,601,778 | 7/1986 | Robb ............................... 156/628 |
| 4,604,345 | 8/1986 | Amemiya ......................... 430/394 |
| 4,652,334 | 3/1987 | Jain et al. ......................... 156/653 |
| 4,657,845 | 4/1987 | Frechet et al. ................ 430/394 X |
| 4,702,995 | 10/1987 | Okada .......................... 430/394 X |
| 4,716,097 | 12/1987 | Weed ............................ 430/394 X |
| 4,772,539 | 9/1988 | Gillespie ......................... 156/628 |
| 4,775,609 | 10/1988 | McFarland ....................... 430/325 |
| 4,803,181 | 2/1989 | Buchmann et al. ............. 156/659.1 |
| 4,808,511 | 2/1989 | Holmes ........................... 156/643 |
| 4,814,243 | 3/1989 | Ziger ........................... 430/394 X |
| 4,931,380 | 6/1990 | Owens et al. ................. 430/326 X |

*Primary Examiner*—Thi Dang
*Attorney, Agent, or Firm*—Wenderoth, Lind & Ponack

[57] ABSTRACT

Disclosed is a fine pattern forming method which is capable of forming a high positive-to-negative reversal pattern high in dry-etch resistance, at high density, by irradiating an entire surface of a resist with ion shower at low doses before or after electron beam or focus ion beam exposure, and then developing it.

4 Claims, 7 Drawing Sheets

FINE PATTERN FORMING METHOD

This application is a continuation of now abandoned application Ser. No. 07/224,008 filed on Jul. 25, 1988 now abandoned.

BACKGROUND OF THE INVENTION

This invention relates to a fine pattern forming method using electron beam or focus ion beam lithography, and more particularly to a fine pattern forming method which is capable of enhancing dry-etch resistance of a resist by ion shower irradiation.

The fine pattern forming process is divided into lithography step and etching step. In order to enhance the dry-etch resistance of the resist pattern formed in the lithography step, it was attempted to improve the resistance of the resist material itself to dry etching by introducing phenyl radicals having a high dry-etch resistance in the resist component or using silicone resin. The dry-etch resistance was also increased by ion implantation after pattern forming.

On the other hand, in the lithography step, in order to form an image reversal pattern, baking or ammonia treatment is carried out, for example, as the treatment after exposure. By such image reversal process, a fine resist pattern will be obtained.

Thus, hitherto, various considerations were given to enhance the dry-etch resistance of the resist itself, but in order to form a fine pattern by raising the resolution, it is necessary to reduce the film thickness of resist. When etching the substance by using such fine pattern as the mask, since the resist itself is etched, it is difficult to transfer the pattern in the etching step when the film thickness is smaller. When attempting to enhance the dry-etch resistance by implanting ions into the resist pattern, ions are also implanted into the semiconductor substrate, and ion irradiation defects may occur.

Besides, in the conventional image reversal process, it can be applied only in a specific resist, and the dry-etch resistance was poor.

SUMMARY OF THE INVENTION

It is hence a primary object of this invention to present a method of forming a fine positive-to-negative reversal pattern which is high in dry-etch resistance, by using a positive resist which is poor in dry-etch resistance but is high in resolution, by applying an ion shower technology before or after electron beam or ion focus beam exposure.

This invention provides various advantages, among which are as follows.

By applying ion shower technology before or after electron beam or focus ion beam exposure, a positive-to-negative reversal pattern high in dry-etch resistance can be formed. Therefore, it is possible to dry-etch the substrate at high precision by using this resist pattern as the mask. In particular, by using a single layer or multiple layers of electron resist poor in dry-etch resistance but high in resolution, dry etching can be performed by forming a fine resist pattern, which may greatly contribute to fabrication of very large integrated circuit.

While the novel features of the invention are set forth in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1A:
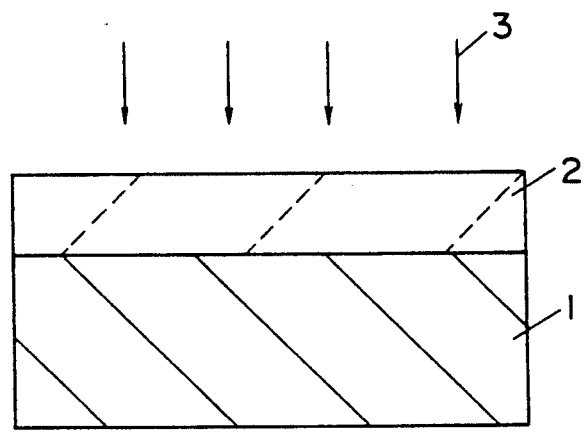
FIGS. 1A-1C show a process sectional view showing a method of a first embodiment of this invention.
Figure 1B:
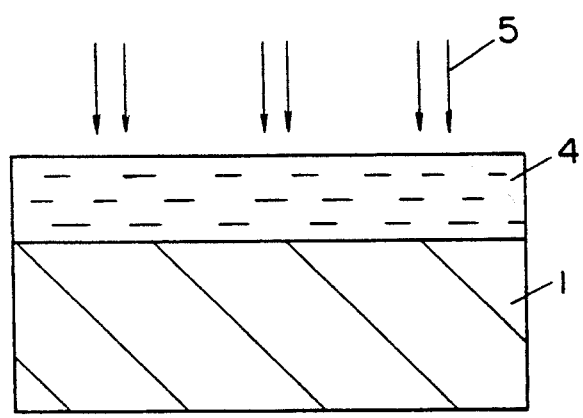
Figure 1C:
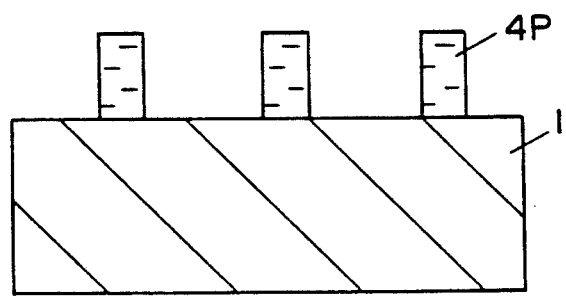

Referring now to FIGS. 1A-1C, an embodiment of this invention is described below. On a semiconductor substrate 1, PMMA which is low in dry-etch resistance and high in resolution was applied as a resist by spin coating at 1000 rpm, and it was baked in an oven for 20 minutes at 170° C. to obtain a resist film 2 of 0.6 μm in thickness. It was irradiated with H+ ions 3 at an accelerating voltage of 40 kV at a dose of $8 \times 10^{13}$ ions/cm$^2$ so as to be soluble in the developer (FIG. 1A).

Then, by exposure to electron beams at an accelerating voltage of 10 keV, beam current density of 40 A/cm$^2$ and dose of $5 \times 10^{14}$ ions/cm$^2$ (FIG. 1B), an H+ ion irradiation region 4 was formed, and by developing in a mixture of methyl isobutyl ketone (MIBK) and isopropyl alcohol (IPA), a positive-to-negative reversal fine resist pattern 4p with a resolution of 0.5 μm was obtained (FIG. 1C). Since this resist pattern 4p was exposed to a total of $5.8 \times 10^{14}$ ions/cm$^2$, the dry-etch resistance was improved about three times. It was therefore possible to dry-etch the substrate by using this resist pattern as the mask.

Thus, according to this embodiment, by irradiating a single layer of electron beam resist poor in dry-etch resistance with H+ ions, a fine positive-to-negative reversal pattern can be formed, and the dry-etch resistance of this resist pattern can be improved more than two times, so that the substrate can be dry-etched by using the electron beam resist single layer as the mask.

Figure 2A:
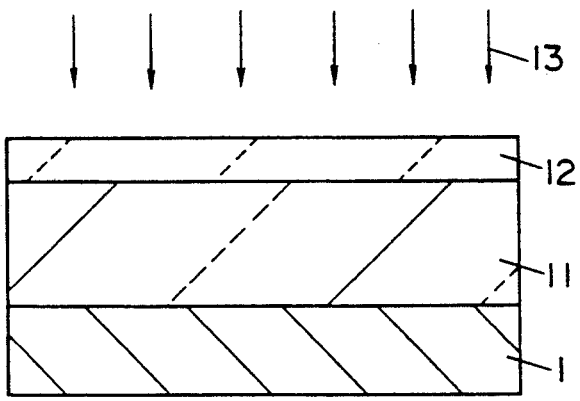
FIGS. 2A-2D show a process sectional view showing a method of a second embodiment of this invention.
Figure 2B:
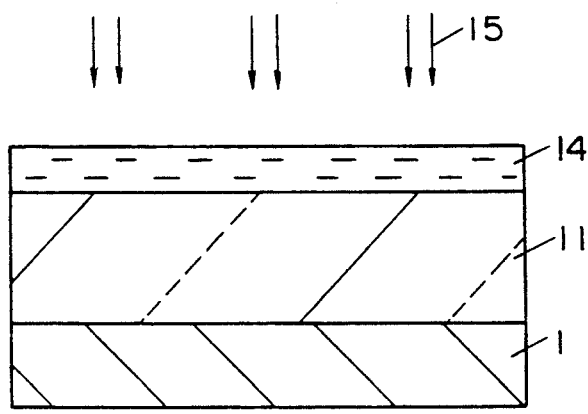
Figure 2C:
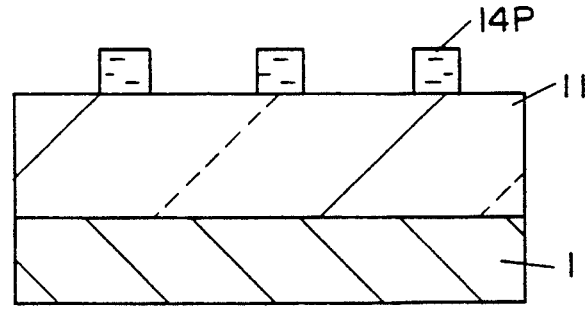
Figure 2D:
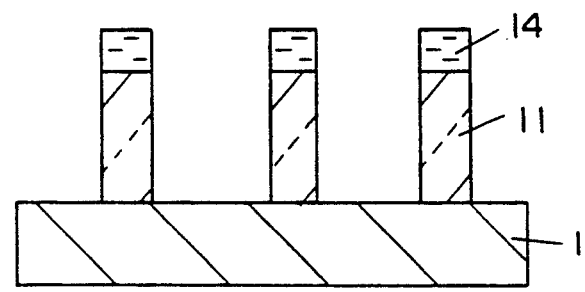

A second embodiment of this invention is shown in FIGS. 2A-2D. A high molecular film 11 was applied on a semiconductor substrate 1 in a thickness of 2 μm by spin coating, and was baked on a hot plate for 2 minutes at 200° C. On this high molecular film 11, a PPMA resist 12 was applied as a resist in a thickness of 0.5 μm by spin coating, and was baked on a hot plate for 2 minutes at 200° C. This was irradiated with Si+ ions at an accelerating voltage of 40 kV and dose of $8 \times 10^{13}$ ions/cm$^2$ so as to be soluble in the developer (FIG. 2A). Then, by exposure to electron beams at an accelerating voltage of 20 keV, beam current density of 40 A/cm$^2$, and dose of $5 \times 10^{14}$ ions/cm$^2$ (FIG. 2B), it was developed in a mixture of MIBK and IPA, and a desired positive-to-negative reversal fine resist pattern 14p was obtained (FIG. 2C). Since this resist pattern was irradiated with Si+ ions by $8 \times 10^{13}$ ions/cm$^2$, the dry-etch resistance was improved about ten times. Using this resist pattern as the mask, the high molecular film in the lower layer was etched, and a fine resist pattern high in aspect ratio and excellent in dry-etch resistance was formed (FIG. 2D).

Figure 6:
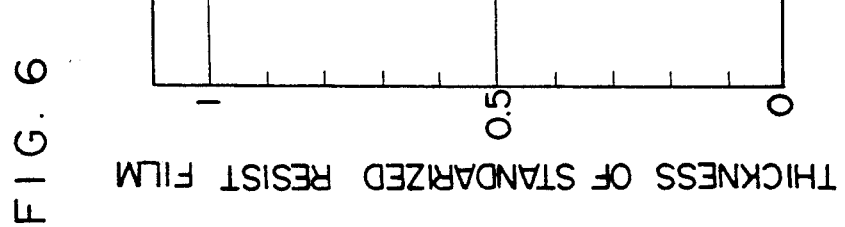
FIG. 6 is a characteristic diagram showing the relation the dose and resist thickness of PMMA resist dipped in developer after H+ ion irradiation.
Figure 7:
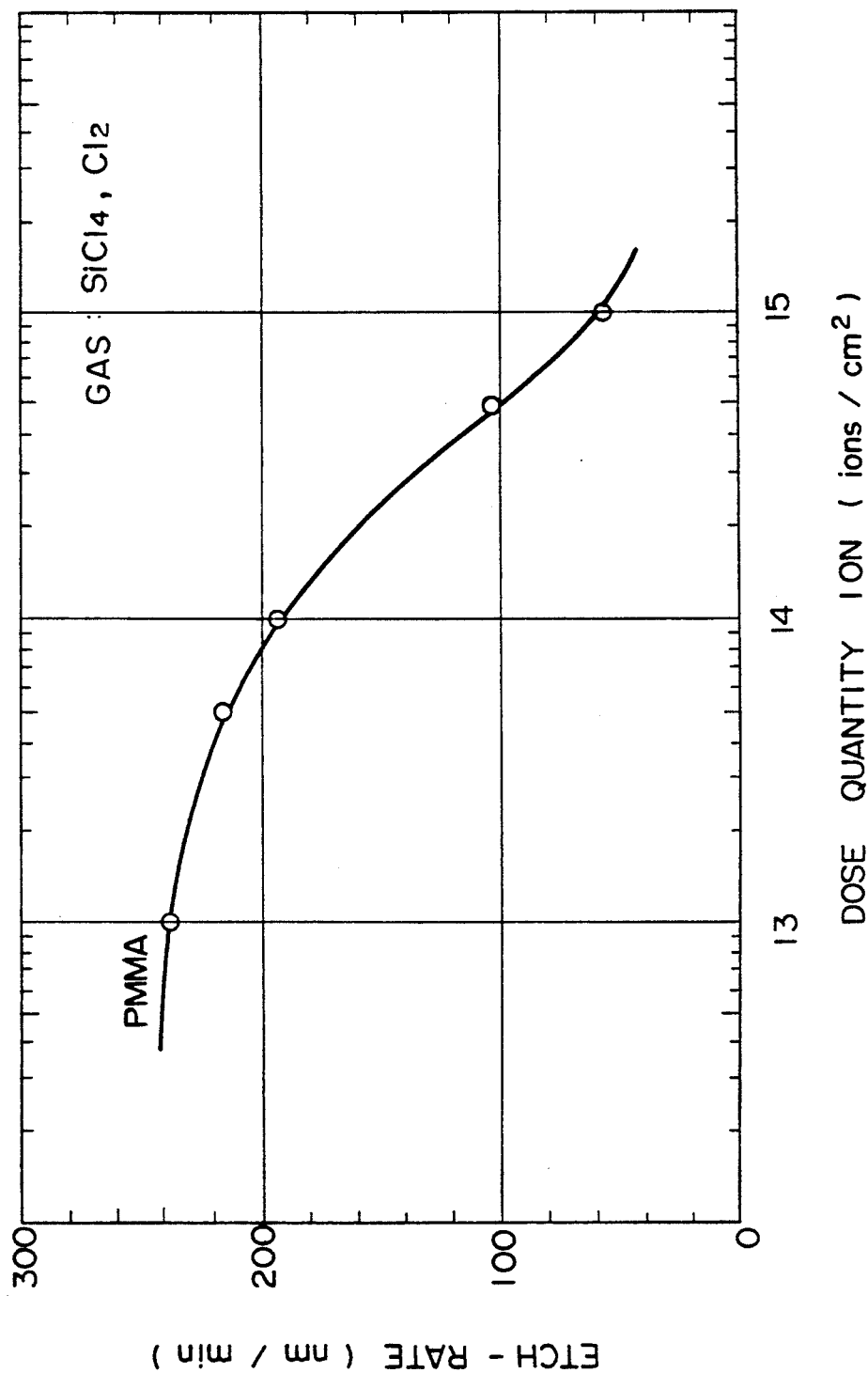
FIG. 7 is a characteristic diagram showing the relation between the dose and etch rate to $SiCl_4$, $Cl_2$ gas of PMMA resist irradiated with H+ ions.

FIG. 6 shows the resist thickness measured after irradiating the electron beam resist PMMA with H+ ions at an accelerating voltage of 40 kV and dipping in the developer. In a dose range of 5 to $9 \times 10^{13}$ ions/cm$^2$, the resist is soluble in the developer, and at a higher dose, it is insoluble. FIG. 7 shows the etching rate of the resist with respect to SiCl$_4$, Cl$_2$ gas after irradiating PMMA resist with H+ ions at accelerating voltage of 40 kV. It is evident that the dry-etch resistance of the PMMA is sharply heightened as the dose is increased. Therefore, by irradiating the resist with ions at 5 to $9 \times 10^{13}$ ions/cm$^2$ before electron beam exposure, the resist is made soluble in the developer. By electron beam exposure, in consequence, the drawn region becomes insoluble in the developer, and by developing it, a positive-to-negative reversal pattern high in dry-etch resistance can be formed. Meanwhile, since the resist is applied on the whole surface of the semiconductor substrate, irradiation ions will not get into the semiconductor substrate, and the substrate will not be damaged.

Figure 3A:
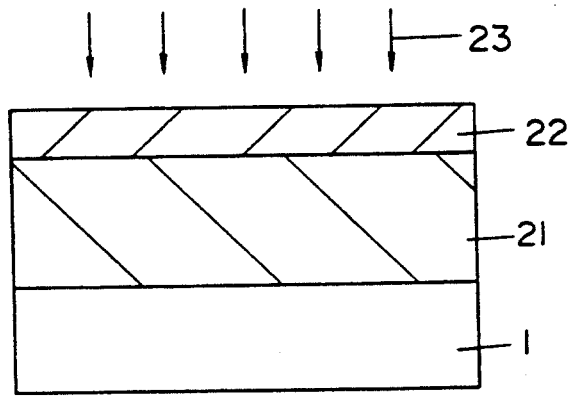
FIGS. 3A-3D show a process sectional view showing a method of a third embodiment of this invention.
Figure 3B:
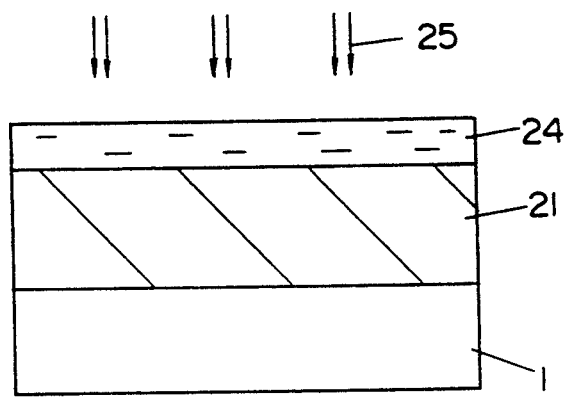
Figure 3C:
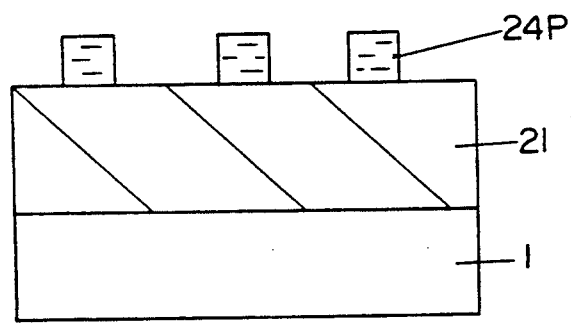
Figure 3D:
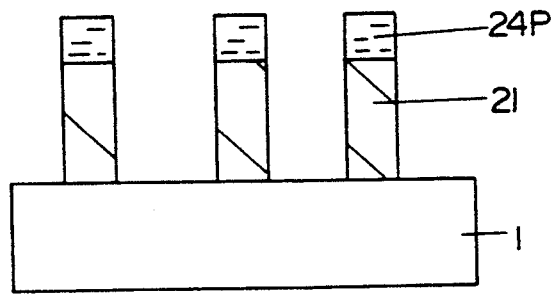

A third embodiment is shown in FIGS. 3A-3D. A high molecular film 21 was applied on a semiconductor substrate 1 in a thickness of 2 μm by spin coating, and was baked on a hot plate for 2 minutes at 200° C. On this high molecular film 21, a PMMA resist 22 was applied as resist in a thickness of 0.5 μm by spin coating, and was baked on a hot plate for 2 minutes at 200° C. It was irradiated with Si+ ions at an accelerating voltage of 40 kV and a dose of $8 \times 10^{13}$ ions/cm$^2$ to be made soluble in the developer (FIG. 3A). It was then exposed to focus Si+ ion beams at an accelerating voltage of 100 keV and a dose of $1 \times 10^{15}$ ions/cm$^2$ (FIG. 3B), and it was developed in a mixture of MIBK and IPA, and a desired positive-to-negative reversal fine resist pattern 24p was obtained (FIG. 3C). Since this resist pattern was exposed to Si+ ions by $1 \times 10^{15}$ ions/cm$^2$, the dry-etch resistance was improved more than 100 times. Using this resist pattern as the mask, the high molecular film in the lower layer was etched, and a fine resist pattern high in aspect ratio and excellent in dry-etch resistance was formed (FIG. 3D).

Figure 4A:
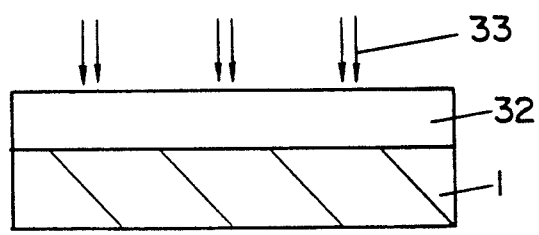
FIGS. 4A-4C show a process sectional view showing a method of a fourth embodiment of this invention.
Figure 4B:
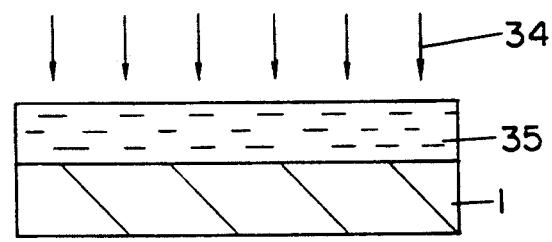
Figure 4C:
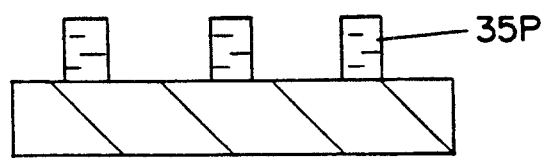

A fourth embodiment is shown in FIGS. 4A-4C. After coating a semiconductor substrate 1 with PMMA which is an electron beam resist low in dry-etch resistance and high in resolution by spinning at 1000 ppm, and baking in an oven for 20 minutes at 170° C., a resist film 32 in a film thickness of 0.6 μm was obtained. It was exposed to electron beams at an accelerating voltage of 20 kV, beam current density of 40 A/cm$^2$, and dose of $5 \times 10^{14}$ ions/cm$^2$ (FIG. 4A). It was further irradiated with H+ ions 34 at an accelerating voltage of 40 kV and dose of $8 \times 10^{13}$ ions/cm$^2$ (FIG. 4B), and was developed in a mixture of MIBK and IPA, and a positive-to-negative reversal fine resist pattern 35p with a resolution of 0.5 μm was obtained (FIG. 4C). Since this resist pattern 35p was exposed to a total of $5.8 \times 10^{14}$ ions/cm$^2$, the dry-etch resistance was improved about three times. It was hence made possible to dry-etch the substrate by using this resist pattern as the mask.

According to this embodiment, thus, by irradiating the electron beam resist single layer poor in dry-etch resistance with H+ ions, the dry-etch resistance can be improved more than twice, and the substrate can be etched by using the electron beam resist single layer as the mask.

In this embodiment, meanwhile, electron beam exposure was employed, but focus ion beam exposure may be similarly performed. Besides, similar effects will be obtained by other positive resist than the PMMA resist. Instead of H+ ions, Si+ ions or others may be also used.

Figure 5A:
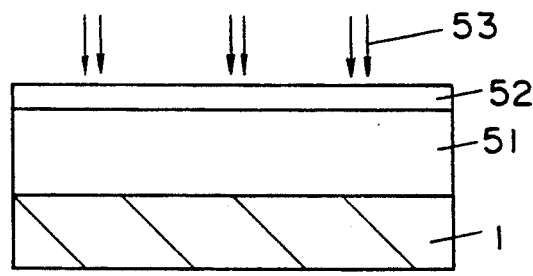
FIGS. 5A-5D show a process sectional view showing a method of a fifth embodiment of this invention.
Figure 5B:
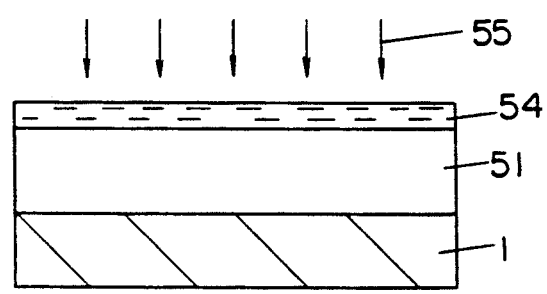
Figure 5C:
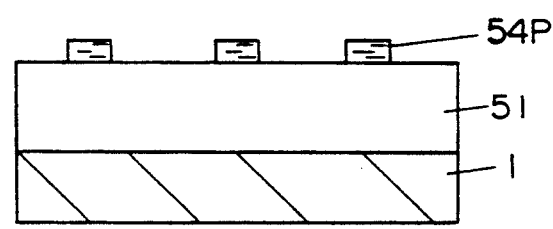
Figure 5D:
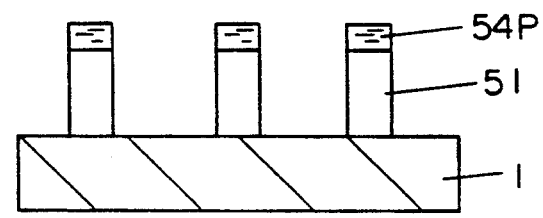

A fifth embodiment is shown in FIGS. 5A-5D. A high molecular film 51 was applied on a semiconductor substrate 1 in a thickness of 2 μm by spin coating, and was baked on a hot plate for 2 minutes at 200° C. On this high molecular film 51, PMMA resist 52 was applied as resist in a thickness of 0.5 μm by spin coating, and it was baked on a hot plate for 2 minutes at 200° C. It was then exposed to Si+ focus ion beams at an accelerating energy of 100 keV, current density of 40 A/cm$^2$ and dose of $1 \times 10^{16}$ ions/cm$^2$ (FIG. 5A). It was then irradiated with Si+ ions 55 at an accelerating voltage of 40 kV and dose of $8 \times 10^{13}$ ions/cm$^2$ (FIG. 5B), and was developed in a mixture of MIBK and IPA to obtained a desired positive-to-negative reversal fine resist pattern 54p (FIG. 5C). Since this resist pattern 54p was irradiated with Si+ ions by $1 \times 10^{16}$ ions/cm$^2$, the dry-etch resistance was enhanced about 100 times. Using this resist pattern as the mask, the high molecular film in the lower layer was etched, and a fine resist pattern high in aspect ratio and excellent in dry-etch resistance could be formed (FIG. 5D).

It is obvious from FIG. 7 that the dry-etch resistance of PMMA is sharply improved as the dose is increased. Therefore, by irradiating with ions by 5 to $9 \times 10^{13}$ ions/cm$^2$ after electron beam or focus ion beam exposure, the drawn region becomes insoluble in the developer, and by developing it a positive-to-negative reversal pattern high in dry-etch resistance will be formed. Besides, since the resist is applied on the entire surface of the semiconductor substrate, irradiated ions will not get into the semiconductor substrate, so that the damage of the substrate may be avoided.

Thus, according to this embodiment, by using a multilayer resist, even on a semiconductor substrate having steps, a positive-to-negative reversal fine resist pattern high in dry-etch resistance and high in aspect ration may be formed by irradiating the resist poor in dry-etch performance with ions.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

We claim:

1. A method for forming a fine pattern of a double-layered photoresist comprising the steps of:
   a. coating a semiconductor substrate with a high molecular weight organic resist as a lower resist of said double-layered photoresist;
   b. coating said high molecular weight organic resist with a positive resist as a upper resist of said double-layered photoresist, wherein said positive resist is insoluble in a developer;
   c. irradiating an entire surface of said positive resist with at least one of H and Si ions in batch at a dosage, whereby said positive resist becomes soluble in said developer;
   d. exposing a portion of said positive resist selectively to electron beams or focused ion beams at a dosage, whereby the selectively exposed portion of said positive resist again becomes insoluble in said developer and has high dry etch resistance;

e. developing said positive resist to form a positive-to-negative reversal pattern of said positive resist; and f. etching said high molecular weight organic resist by using said positive resist pattern as a mask.

2. The fine pattern forming method according to claim 1, wherein the positive resist is PMMA and the ion irradiation of step c. is carried out at an accelerating voltage of 10 to 40 kv, and at a dosage of $5 \times 10^{13}$ to $9 \times 10^{13}$ ions/cm.

3. A method for forming a fine pattern of a double-layered photoresist comprising the steps of:

a. coating a semiconductor substrate with a high molecular weight organic resist as a lower resist of said double-layered photoresist;

b. coating said high molecular weight organic resist with a positive resist as a upper resist of said double-layered photoresist, wherein said positive resist is insoluble in a developer;

c. exposing a portion of said positive resist selectively to electron beams or focused ion beams at a dosage, whereby the selectively exposed portion of said positive resist becomes soluble in said developer;

d. irradiating an entire surface of said positive resist with at least one of H and Si ions in batch at a dosage, whereby the exposed portion at step c. of said positive resist again becomes insoluble in said developer and has high dry etch resistance, and unexposed portion at step c. of said positive resist becomes soluble in said developer;

e. developing said positive resist to form a positive-to-negative reversal pattern of said positive resist; and f. etching said high molecular weight organic resist by using said positive resist pattern as a mask.

4. The fine pattern forming method according to claim 3, wherein the positive resist is PMMA and the ion irradiation of step d. is carried out at an accelerating voltage of 10 to 40 kv, and at a dosage of $5 \times 10^{13}$ to $9 \times 10^{13}$ ions/cm.

* * * * *